(12) United States Patent
Freeman

(10) Patent No.: US 7,671,603 B2
(45) Date of Patent: Mar. 2, 2010

(54) SCREENING OF ELECTROLYTIC CAPACITORS

(75) Inventor: Yuri Freeman, Greer, SC (US)

(73) Assignee: Kemet Electronics Corporation, Greenville, SC (US)

( * ) Notice: Subject to any disclaimer, the term of this patent is extended or adjusted under 35 U.S.C. 154(b) by 184 days.

(21) Appl. No.: 11/641,928

(22) Filed: Dec. 18, 2006

(65) Prior Publication Data

US 2008/0143342 A1 Jun. 19, 2008

(51) Int. Cl.
*G01R 31/12* (2006.01)
(52) U.S. Cl. ..................................... 324/548
(58) Field of Classification Search ................ 324/548
See application file for complete search history.

(56) References Cited

U.S. PATENT DOCUMENTS

| | | | | |
|---|---|---|---|---|
| 4,216,424 | A | * | 8/1980 | Vette .......................... 324/659 |
| 4,419,385 | A | * | 12/1983 | Peters ........................ 427/583 |
| 5,882,719 | A | | 3/1999 | Creasi, Jr. |
| 5,936,409 | A | * | 8/1999 | Nishioka .................... 324/548 |
| 6,280,483 | B1 | | 8/2001 | Shimamoto et al. |
| 6,489,783 | B1 | * | 12/2002 | Liu et al. .................... 324/663 |
| 2002/0140440 | A1 | * | 10/2002 | Haase ........................ 324/678 |
| 2003/0002368 | A1 | * | 1/2003 | Kang et al. ................. 365/201 |

OTHER PUBLICATIONS

*Failure Modes of Tantalum Capacitors Made by Different Tehcnologies*, P. Vasina, et al., AVX online, presentes at Carts USA 2001, CTI Carts USA 01, 6 pages.
*Conductivity Mechanisms and Breakdown Characteristics of Niobium Oxide Capacitors*, J. Sikula et al., AVX Corporation 2003, 5 pages.
*Analysis of Solid Tantalum Capacitor Leakage Current*, R. W. Franklin, AVX Techincal Information, 7 pages.
Kemet Catalog: Insulation Resistance, MIL-STD-202G, Method 302, pp. 1, 2, Feb. 6, 1956.
MIL-PRF-55365F, Apr. 16, 2004.
MIL-PRF-39003L, Apr. 14, 2008.
MIL-STD-202, Jul. 18, 2003.
http://www.avx.com/docs/masterpubs/tantniob.pdf.
http://www.avx.com/docs/masterpubs/smccp.pdf.
F3102P SMT Catalog—Full 2008-06.pdf Kemet Corporation.
http://www.vishay.com/docs/49663/pl0359.pdf.
http://www.vishay.com/docs/40088/perfchar.pdf.
Reference Data for Engineers, Edward C. Jordan Editor in Chief, Haward W. Sams and Co. 1985, p. 5-16.

* cited by examiner

*Primary Examiner*—Jeff Natalini
(74) *Attorney, Agent, or Firm*—Joseph T. Guy; Nexsen Pruet, LLC

(57) ABSTRACT

A method for screening electrolytic capacitors places a capacitor in series with a resistor in series with a resistor, applying a test voltage and following the charge curve for the capacitor. A high voltage drop indicates high reliability and a low voltage drop is used to reject the piece. The leakage current is not adversely affected during the test.

8 Claims, 3 Drawing Sheets

Charge curves for two D-case polymer tantalum capacitors 15 uF – 25 V.

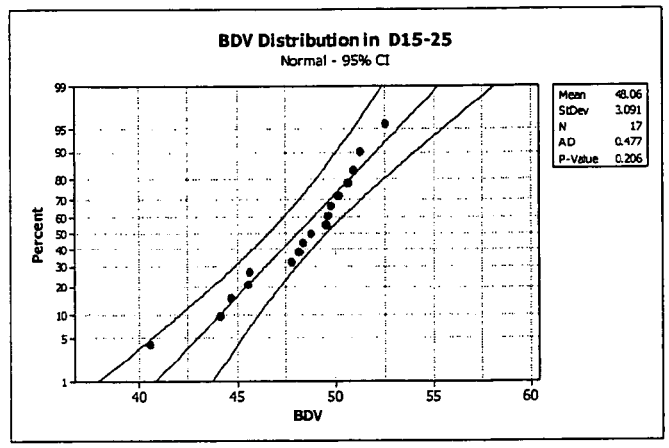
Fig. 1. Breakdown voltage in D-case polymer Ta capacitors 15 uF – 25 V.
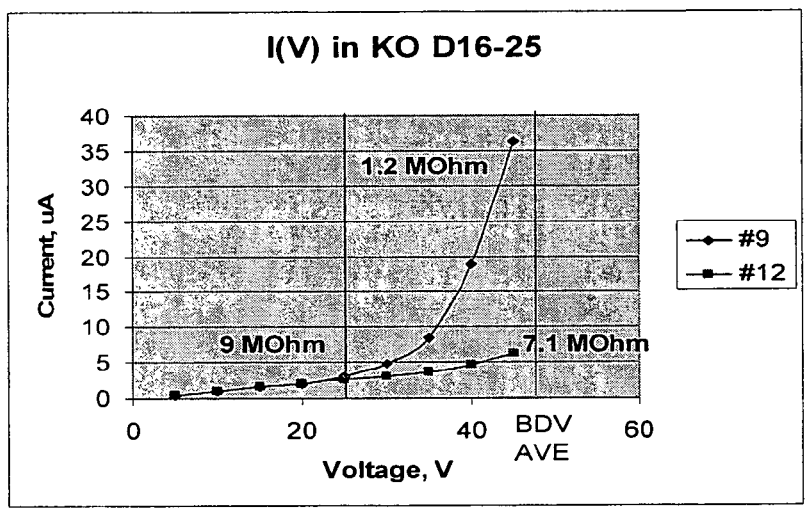
Fig. 2. I(V) characteristics of D-case polymer tantalum capacitors 15 uF – 25 V.

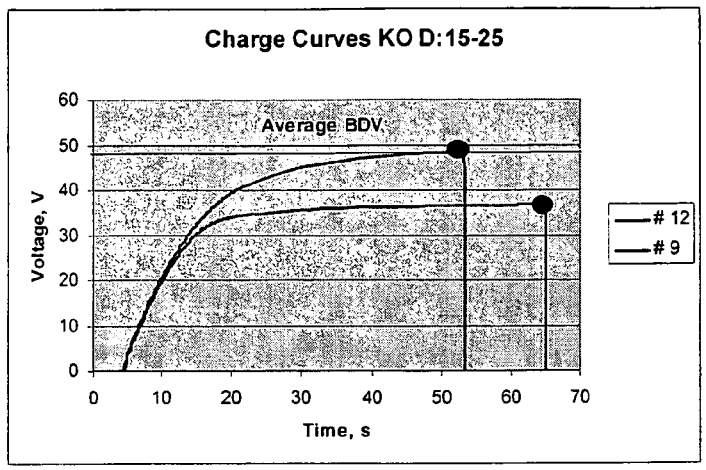
Fig. 3. Charge curves for two D-case polymer tantalum capacitors 15 uF – 25 V.
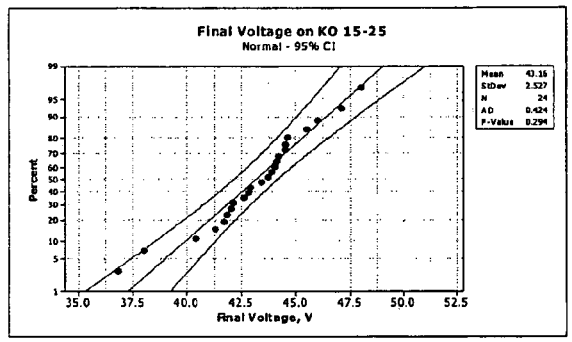
Fig. 4. Final voltage drop on polymer Ta capacitors D15-25
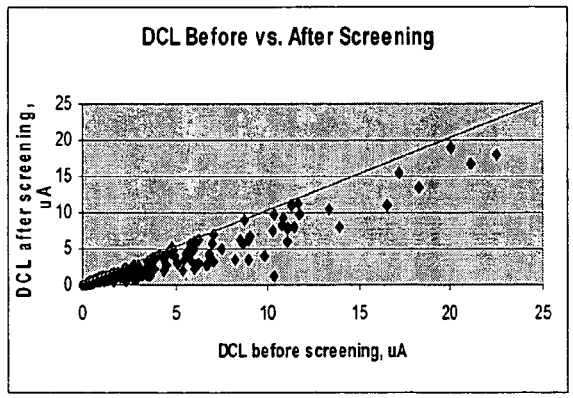
Fig. 5. DCL before vs. after screening in D-case polymer Ta capacitors 15 uF – 25 V

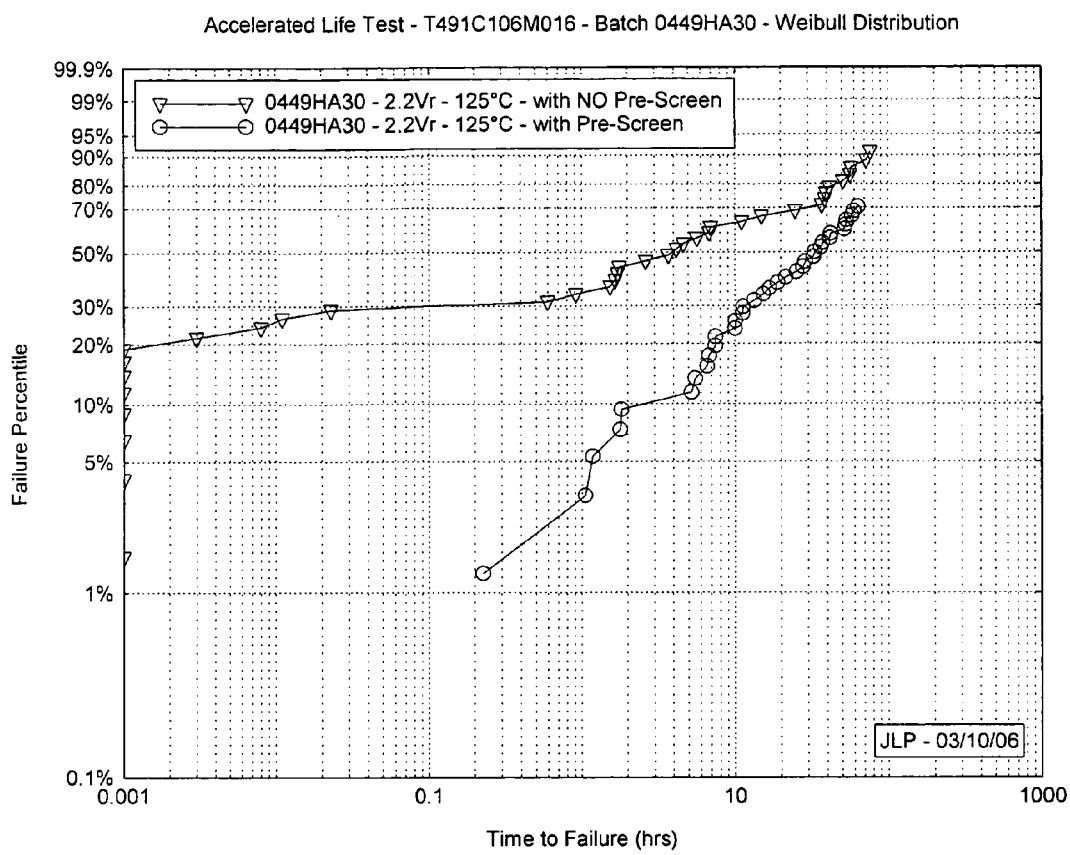
Fig. 6. Accelerated life test at 85° C and 1.32 x rated voltage with and without the screening.

SCREENING OF ELECTROLYTIC CAPACITORS

BACKGROUND OF THE INVENTION

1. Field of the Invention

The invention relates to screening of electrolytic capacitors. It can be used for screening out unreliable parts from the general population of the capacitors as well as for screening for most reliable capacitors for special applications such as medical and military applications. It can be also used for comparison of different materials and manufacturing techniques.

2. Background and Prior Art

Accelerated aging at elevated voltage and temperature, surge tests, re-flow test, etc. are incorporated in manufacturing of electrolytic capacitors to display hidden defects in the dielectric and to screen for non-reliable parts. The problem with these techniques is that they cannot guarantee exclusion of all the non-reliable parts and, when intensified, can deteriorate performance and reliability of the general population of the capacitors as a result of the testing.

U.S. Pat. No. 5,882,719 issued Mar. 16, 1999 to R. Creasi is exemplary of the prior art. This patent describes a test that provides reliability indication at early stages of the manufacturing of solid Ta capacitors. This test comprises testing in a wet cell Ta capacitors partially impregnated with solid electrolyte using static voltage exceeding working voltage (WV) or in gradually increased (sweep) voltage exceeding WV. In both cases the applied voltage results in electrical breakdown of the dielectric in poor capacitors, while good capacitors survive the test and continue through the manufacturing process.

BRIEF DESCRIPTION OF THE INVENTION

This test, according to this invention, uses breakdown voltage (BDV) as an ultimate indicator of the quality of the dielectric in the electrolytic capacitors. At the same time, this test can't be used for screening of finished encapsulated capacitors. At that stage applied voltage which is sufficient for breaking the dielectric in a poor part, damages the dielectric in good parts. This damage can't be repaired in finished parts by re-formation of the dielectric in a wet cell as it was described in the prior art. The screening according to this invention should be performed on parts either prior to or after conventional aging and tests.

The purpose of this screening is to imitate the BDV test and remove unreliable parts with poor dielectric without actual breaking of the dielectric or deteriorating quality of the tested capacitors. To accomplish this, dc voltage equal to or exceeding average breakdown voltage (BDV) is applied to the tested capacitor which is connected to a series resistor $R_s$, wherein 0.1 Mohm$<R_s<$10 Mohm. The voltage increase on the capacitor (charge curve) is monitored, and the test is terminated either when voltage drop on the tested capacitor reaches average BDV or after time t, where 0.5 min$<$t$<$5 min. Final voltage drop on the capacitor indicates quality of the dielectric and is used for the screening purposes.

BRIEF DESCRIPTION OF THE DRAWINGS

FIG. 1 shows a typical breakdown voltage distribution for a TA capacitor 15 μF-25V.

FIG. 2 shows typical current/voltage curves for D-case Ta polymer capacitors 15 μF-25V.

FIG. 3 shows typical charging curves for Ta polymer capacitors.

FIG. 4 illustrates typical final voltage drop distributions for 15 μF-25V Ta polymer capacitors FIG. 5 shows dc leakage before and after screening using the inventive process.

FIG. 6 shows accelerated life test distribution data at 85° C. and 1.32× rated voltage with and without the screening process.

DETAILED DESCRIPTION OF THE INVENTION

Parameters of the screening, including average BDV and series resistance $R_s$, should be determined on a small group of samples from given type of the capacitors prior to the screening process. To determine the average BDV, dc voltage is gradually increased on the capacitor connected to a fuse until rapid current increase in the circuit and/or a blown fuse indicate a breakdown. As an example, FIG. 1 demonstrates typical distribution of the BDV in D-case polymer tantalum capacitors 15 uF-25V.

In the distribution shown, the left "tail" with low BDV represents unreliable capacitors with weak dielectric, while right end of the distribution with high BDV represents highly reliable capacitors with robust dielectric. At the same time, it is obvious that this BDV test can not be used for screening purpose since all the tested capacitors are electrically broken to determine the endpoint of the test.

To determine series resistance $R_s$, the current (I)-vs. voltage (V) characteristics should be investigated in the range of dc voltages from working voltage (WV) to the BDV. As an example, FIG. 2 shows typical I(V) characteristics of two D-case polymer tantalum capacitors 15 uF-25 V.

As one can see, these two capacitors have practically equal currents at WV, which makes them look identical at conventional testing. However, their currents and, thereby, resistances are different when applied voltage approaches average BDV. High resistance in the vicinity of the average BDV correlates with high actual BDV and vice versa. The $R_s$ is chosen as an average resistance of the capacitors in vicinity of the BDV. If the resistance of the capacitor in vicinity of the BVD is lower than Rs (like in the part #9), the larger part of the applied voltage will drop on the Rs, making final voltage drop on the capacitor small as shown in FIG. 3. If the resistance of the capacitor in vicinity of the BDV is higher that Rs (like in the part #12), the most of the applied voltage will drop on the capacitor, making final voltage drop high (FIG. 3).

The applied dc voltage is selected to be between the average breakdown voltage and 1.5 times the average breakdown voltage. If the applied dc voltage is below average BDV, it is impossible to achieve BDV during charging. If the applied dc voltage equals average BDV, the charging time is too long. If applied dc voltages is above 1.5 times average BDV, the increase in voltage is too rapid and hampers screening accuracy.

With the average BDV and $R_s$ determined on a small group of samples, screening can be performed on all of the population of the capacitors with given capacitance and rated voltage. As an example FIG. 3 demonstrates typical screening procedure (charge curves) for the two D-case polymer tantalum capacitors 15 uF-25 V. In this example, the parameters of screening were as follows: average BDV=48V, Rs=2 Mohm, and maximum screening time t=1 min.

According to the FIG. 3, the voltage drop on the first capacitor reached average BDV after 52 s. At that moment, voltage application was terminated. On the second capacitor, voltage drop reached its maximum at about 40 s and didn't change after that until voltage application was terminated after 1 min of the test. The final voltage drop on the second capacitor was below average BDV due to noticeable voltage drop on the $R_s$. This indicates low resistance of the second capacitor in vicinity of the average BDV and, thereby, weaker dielectric in the capacitor vs. that in the first capacitor. A distribution of the final voltage drop on a population of the D-case Ta polymer capacitors 15 uF-25 V is shown on the FIG. 4.

The lower left part of this distribution represents unreliable capacitors with weak dielectric that were removed from the population. The central part of the population represents normal capacitors. The high right part of the population represents exceptional quality capacitors suitable for special applications.

To guarantee that the capacitors are not damaged during the screening, the dc leakage (DCL) at rated voltage was tested on these capacitors before and after the screening procedure (FIG. 5).

As one can see, all the experimental points are either on the diagonal or below the diagonal, which indicates no change or improvement in quality of the dielectric as a result of screening. Lower DCL after the screening can be attributed to self-healing phenomena, when high voltage is applied briefly to the capacitor in the circuit with limited current.

FIG. 6 demonstrates results of the accelerated life test of the capacitors without and with this screening. During the screening, the capacitors with low final voltage drop were removed from the general population of the capacitors subjected to the accelerated test.

According to the FIG. 6, screening enables one to eliminate early failures. After selection by this screening, the failures start at a later time and with a much lower percentage of failed parts. This is the evidence that non-reliable capacitors with weak dielectric can be removed from the general population by this screening method. The distribution of the failures after the screening falls into a simple pattern, which indicates uniform degradation mechanism in the tested capacitors.

INDUSTRIAL UTILITY

The method of this invention maybe used to remove potentially deflective capacitors before completion of the manufacturing process, thereby reducing manufacturing costs. The enabled identification of higher quality units reduces returns and in-use failures.

The invention has been described in terms of representative examples which are not limitative of the scope of the invention. Modifications apparent to those with skill in the art are included within the scope of the invention.

The invention claimed is:

1. A method for screening a population of electrolytic capacitors comprising:
    applying a common dc voltage equal to or greater than an average breakdown voltage to each capacitor and an associated resistor while each capacitor is connected in series with said associated resistor Rs, wherein 0.1 Mohm<Rs<10 Mohm;
    monitoring the charge curve of each capacitor and associated resistor until the voltage drop reaches the average breakdown voltage or until time t is reached, wherein 0.5 mm<t<5 mm; and
    sorting the population of electrolytic capacitors based on observed voltage drop.

2. A method according to claim 1 wherein the average breakdown voltage is established prior to the screening.

3. A method according to claim 1 wherein $R_s$ is established prior to the screening.

4. A method according to claim 1 wherein the applied dc voltage is between the average breakdown voltage and 1.5 times average breakdown voltage.

5. A method according to claim 1 wherein said capacitors are rejected if they are within 1% to 10% of the low end of the population, depending on the capacitor type and possible application.

6. A method according to claim 1 wherein said capacitors are screened after assembly, final ageing and testing.

7. A method according to claim 1 wherein said capacitors are screened in at least one of prior to assembly, after assembly, prior to final aging, after final aging, prior to final testing and after final testing.

8. A method for screening a population of electrolytic capacitors comprising:
    applying a common dc voltage equal to or greater than an average breakdown voltage to each capacitor and an associated resistor while each capacitor is connected in series with said associated resistor Rs, wherein 0.1 Mohm<Rs<10 Mohm;
    monitoring the charge curve of each capacitor and associated resistor until the voltage drop reaches the average breakdown voltage or until time t is reached, wherein 0.5 mm<t<5 mm; and
    sorting the population of electrolytic capacitors based on observed voltage drop;
    wherein said capacitors are screened after assembly, final ageing and testing; and
    wherein said capacitors are rejected if they are within 1% to 10% of the low end of the population, depending on the capacitor type and possible application.

* * * * *